(12) United States Patent
Tanaka et al.

(10) Patent No.: US 10,804,621 B2
(45) Date of Patent: Oct. 13, 2020

(54) PRINTED WIRING BOARD

(71) Applicant: KABUSHIKI KAISHA TOSHIBA, Minato-ku (JP)

(72) Inventors: Akira Tanaka, Yokohama (JP); Masaya Hirashima, Yokohama (JP); Satoru Yasui, Kawasaki (JP); Shukuyo Yamada, Yokohama (JP); Masashi Watanabe, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/524,225

(22) Filed: Jul. 29, 2019

(65) Prior Publication Data

US 2020/0044366 A1 Feb. 6, 2020

(30) Foreign Application Priority Data

Aug. 6, 2018 (JP) .................. 2018-147787

(51) Int. Cl.
- *H05K 1/18* (2006.01)
- *H01R 4/02* (2006.01)
- *H05K 1/11* (2006.01)

(52) U.S. Cl.
CPC ............. *H01R 4/027* (2013.01); *H01R 4/028* (2013.01); *H05K 1/117* (2013.01); *H05K 1/181* (2013.01); *H05K 2201/09036* (2013.01); *H05K 2201/2027* (2013.01)

(58) Field of Classification Search
CPC ......... H01R 12/707; H05K 1/18; H05K 1/181
See application file for complete search history.

(56) References Cited

U.S. PATENT DOCUMENTS

| | | | |
|---|---|---|---|
| 9,401,575 B2 | 7/2016 | Bosch | |
| 2008/0146051 A1* | 6/2008 | Honda | ............... H01R 43/0256 439/66 |
| 2014/0353031 A1 | 12/2014 | Bosch | |

FOREIGN PATENT DOCUMENTS

| | | |
|---|---|---|
| JP | 2009-266949 A | 11/2009 |
| JP | 2012-19101 A | 1/2012 |
| TW | I558040 B | 11/2016 |

\* cited by examiner

*Primary Examiner* — Jeremy C Norris
(74) *Attorney, Agent, or Firm* — Oblon, McClelland, Maier & Neustadt, L.L.P.

(57) ABSTRACT

According to one embodiment, a printed wiring board includes a wiring board, a connector part, a connection pad provided between the wiring board and the connector part and connected with the connector part with a solder material and a guide groove provided in the wiring board to be continuous to the connection pad, to guide a portion of the solder material from the connection pad.

9 Claims, 10 Drawing Sheets

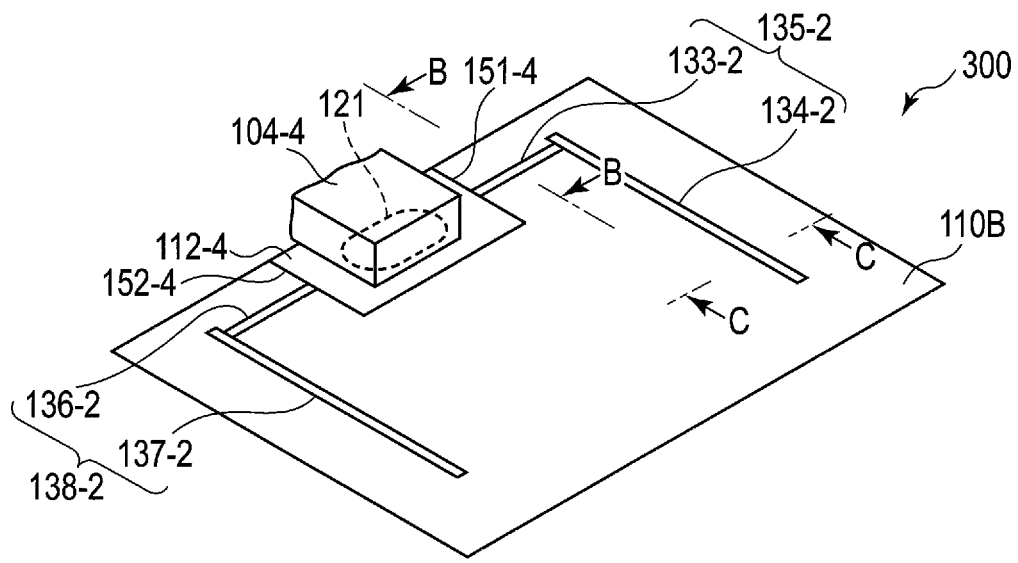
F I G. 7
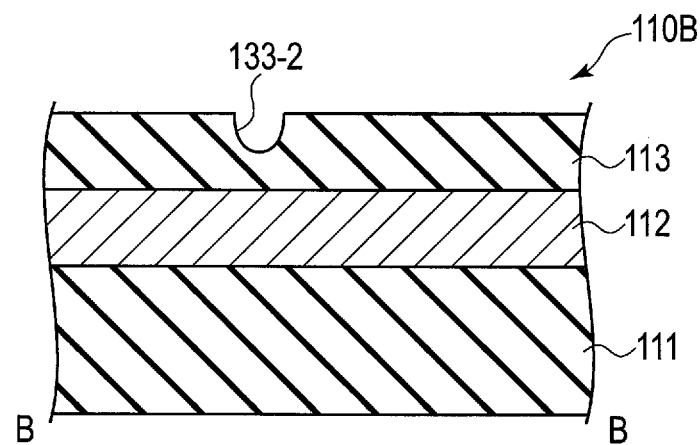
F I G. 8

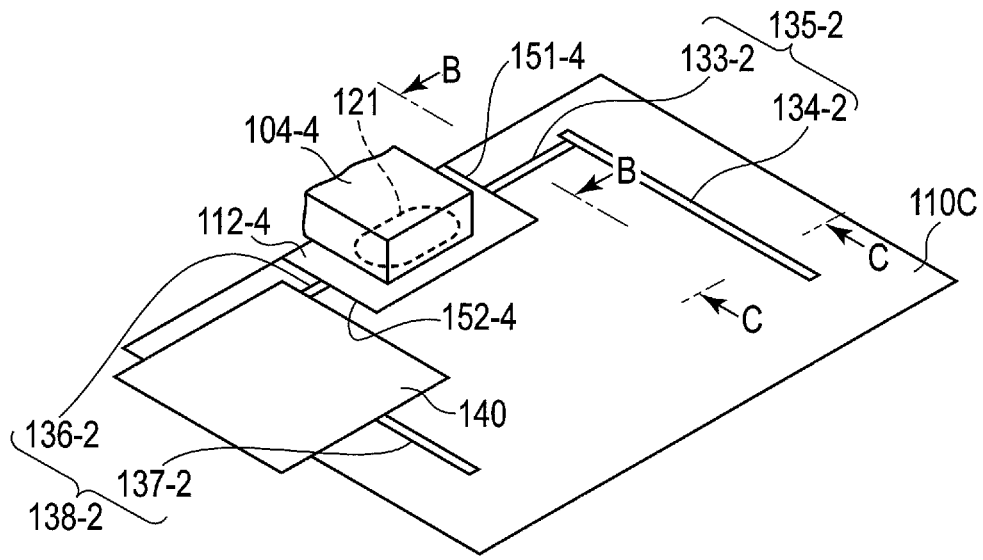
F I G. 11
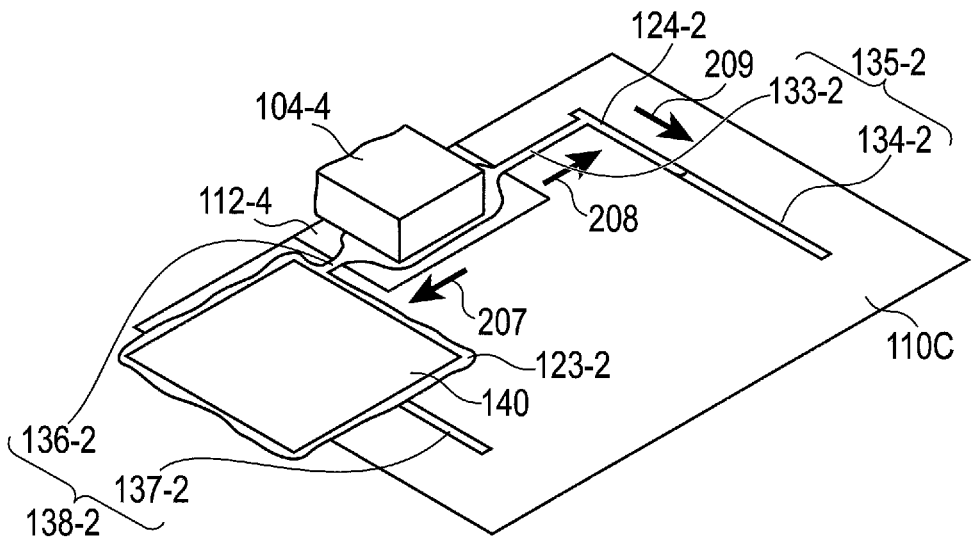
F I G. 12

PRINTED WIRING BOARD

CROSS-REFERENCE TO RELATED APPLICATIONS

This application is based upon and claims the benefit of priority from Japanese Patent Application No. 2018-147787, filed Aug. 6, 2018, the entire contents of which are incorporated herein by reference.

FIELD

Embodiments described herein relate generally to a printed wiring board.

BACKGROUND

In electronic devices, miniaturization and unitization of connector parts progress, and the internal structures of the devices are made compact, which contributes to the downsizing and weight reduction of products. Moreover, as to the thickness of the products, such a type of parts that is called "onboard" in which connector parts are mounted on a printed wiring board (PWB), and also offset parts in which PWB is partially cut and connector parts are mounted thereon are widely used, which contributes to thinning of the products.

As the miniaturization of connector parts progresses, the durability against prying and the like, to which the parts may be exposed to when handled by the user is listed as an important item in the process of designing the parts. In order to improve the load-carrying capacity of connector parts, reinforcement pins, which are not directly related to the functions of the parts themselves, are widely employed. In some cases, such reinforcement pins are fixed to respective joints by screw clamps, but they are needed in many cases to be soldered because the mount areas are limited.

As to the soldering material, a flux is added to a solder metal in consideration of the soldering properties when parts are mounted. The kind and amount of the flux to be used is selected and adjusted in each occasion to improve the activity performance, and to raise the quality of the connector parts mounted.

However, due to the complication of the internal structures, which occurs along to the reduction in size, an increase in number of pins, and the like, the voids between members which constitute connector parts, such as metal shells, contacts and molds are narrowed. Thus, capillarity occurs in voids during the time of solder reflow, which makes it easy to suction the flux up.

BRIEF DESCRIPTION OF THE DRAWINGS

FIG. 7 is a diagram schematically showing a state of a guide groove used in the second embodiment before reflow.

FIG. 8 is a diagram showing an example of a cross section taken along line B-B in FIG. 7.

FIG. 11 is a diagram schematically showing a state of a guide groove used in the third embodiment before reflow.

FIG. 12 is a diagram schematically showing the state after reflow in FIG. 11.

DETAILED DESCRIPTION

In general, according to one embodiment, a printed wiring board comprises a wiring board, a connector part, a connection pad provided between the wiring board and the connector part and connected with the connector part with a solder material and a guide groove provided in the wiring board to be continuous to the connection pad, to guide a portion of the solder material from the connection pad.

Hereafter, embodiments will be described with reference to FIGS. 1 to 6.

First Embodiment

Figure 1:
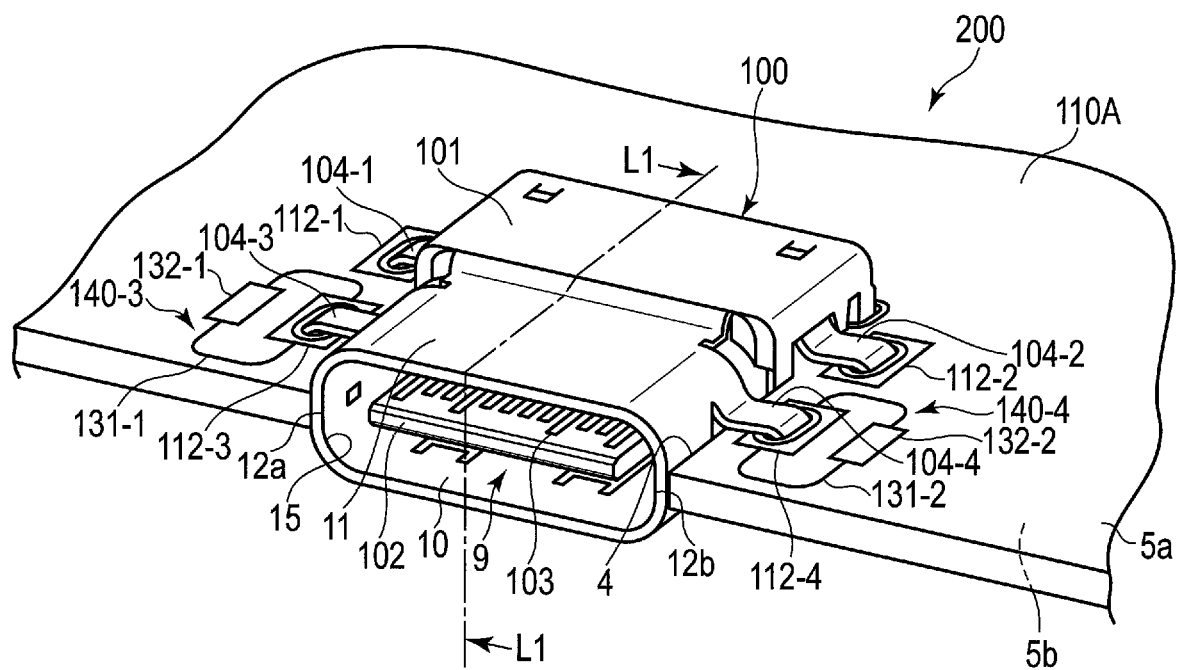
FIG. 1 is a perspective view of a printed wiring board according to the first embodiment.

FIG. 1 is a perspective view showing a printed wiring board 1 to be used in an electronic device or more specifically, for example, a cellular phone or a digital camera.

Figure 2:
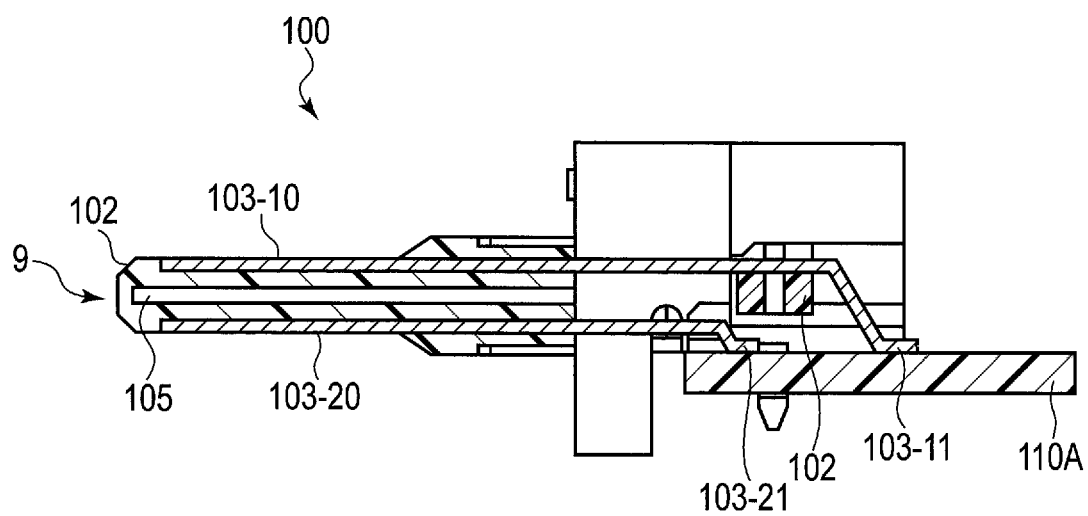
FIG. 2 is a cross section taken along line L1-L1 in FIG. 1.

FIG. 2 is a cross section taken along line L1-L1 in FIG. 1, in which the section of a shell 101 is omitted.

As shown in FIGS. 1 and 2, a printed wiring board 200 of this embodiment comprises a wiring board 110A and a USB connector 100 mounted in the wiring board 110A, as its main elements. The USB connector 100 is an example of surface-mount connector parts.

According to this embodiment, the wiring board 110A comprises a cut portion 4. The cut portion 4 is a cut formed to open in one edge of an outer circumferential edge of the wiring board 110A. The cut portion 4 defines a rectangular space to which the USB connector 100 is to be inserted.

The wiring board 110A further comprises a flat front surface 5a and a back surface 5b, continuous to the cut portion 4. As connect pads, four reinforcement pads 112-1, 112-2, 112-3 and 112-4 are provided on the front surface 5a of the wiring board 110A. The reinforcement pads 112-1, 112-2, 112-3 and 112-4 are arranged on the front surface 5a of the wiring board 110A so that they are located to adjoin four corner portions of the rectangular space of the cut portion 4.

According to this embodiment, the USB connector 100 is the so-called offset-type connector, and is mounted in the front surface 5a of the wiring board 110A in a state that it is dropped into the cut portion 4 of the wiring board 110A. In the first embodiment, the amount that dropped is 2.29 mm, and a lower surface of the connector portion is recessed from the surface of the substrate by an amount corresponding to the amount that dropped. In this embodiment, the surface-mount connector is not limited to the USB connector 100, but it may be, for example, a microphone jack connector in/from which a microphone plug of an external microphone is plugged and unplugged, or a remote control connector in/from which a plug of a remote control cable is plugged or unplugged. Thus, the type of connector is not particularly limited.

Further, the surface-mount connector may be applied to not only the offset type, in which it is dropped into the cut portion 4 of the wiring board 110A, but it may be similarly applied to an on-board connector as well, to be placed on the front or back surface of the wiring board 110A.

As shown in FIGS. 1 and 2, the USB connector 100 comprises a shell 101 and a terminal table 9 as its main elements. The shell 101 is an element which constitutes the outline of the USB connector 100, and is formed, for example, from a sheet metal material into a flat pipe shape.

More specifically, the shell 101 comprises a bottom plate portion 10, a top plate portion 11 and side plate portions 12a and 12b on both right and left sides. The bottom plate portion 10 and the top plate portion 11 oppose each other with an interval therebetween along a thickness direction of the USB connector 100. The side plate portion 12a, one of the side plate portions, is formed to stand up to connect one side edge of the bottom plate portion 10 and one side edge of the top plate portion 11 to each other. The other side plate portion 12b is formed to stand up to connect the other side edge of the bottom plate portion 10 and the other side edge of the top plate portion 11 to each other. Thus, the side plate portions 12a and 12b oppose each other with an interval therebetween along a width direction of the USB connector 100.

Further, a front edge of the bottom plate portion 10, a front edge of the top plate portion 11, and front edges of the both side plate portions 12a and 12b are situated in cooperation with each other to define an opening 15. The opening 15 is a structural element to which, for example, a plug of a USB device (not shown) is detachably engaged, and has a shape slenderly elongated along the width direction of the USB connector 100.

The terminal table 9 is formed from an electrically insulating synthetic resin material, and is accommodated inside the shell 101. The terminal table 9 includes a tabular tongue-like piece 102. The tabular tongue-like piece 102 extends towards the opening 15 of the shell 101.

A plurality of contact terminals 103 are supported on the terminal table 9. The contact terminals 103 are arranged at intervals along the width direction of the USB connector 100. One end portion of each contact terminal 103 includes an upper contact terminal portion 103-10 guided to an upper surface of the tabular tongue-like piece 102 of the terminal table 9, and a lower contact terminal portion 103-20 thereof guided to a lower surface of the tabular tongue-like piece 102. Between the upper surface and the lower surface of the tabular tongue-like piece 102, a metal plate 105 is formed for reinforcement, grounding or shielding. The metal plate 105 may be connected to a grounding wire (not shown) of the wiring board 110A.

The other end portion of each contact terminal 103 is located in a rear end portion of the terminal table 9, and further bent downward towards the wiring board 110A. The other end portion of the upper contact terminal portion 103-10 is soldered to the wiring board 110A by a soldering portion 103-11. The other end portion of the lower contact terminal portion 103-20 is soldered to the wiring board 110A by a soldering portion 103-21. Alternatively, such a structure may be adopted. That is, a plurality of through holes (not shown) are formed to penetrate the wiring board 110A, and the other end portions of the upper contact terminal portions 103-10 and the other end portions of the lower contact terminal portions 103-20 are inserted to the through holes and soldered thereto. Thus, the contact terminals 103 of the USB connector 100 are electrically connected to the conductor layer of the wiring board 110A.

As shown in FIG. 1, a pair of first reinforcing terminals 104-1 and 104-2 and a pair of second reinforcing terminals 104-3 and 104-4 are formed to be integrated with the shell 101 of the USB connector 100 as one body. The first reinforcing terminals 104-1 and 104-2 and the second reinforcing terminals 104-3 and 104-4 are plate-liked structural elements to fix the USB connector 100 into the cut portion 4 of the wiring board 110A in a drop-in state.

In this embodiment, the first reinforcing terminals 104-1 and 104-2 and the second reinforcing terminals 104-3 and 104-4 are placed respectively in the four corners of the shell 101 so as to correspond to, for example, the reinforcement pads 112-1, 112-2, 112-3 and 112-4 of the wiring board 110A, respectively. The locations of the first reinforcing terminal 104-1 and 104-2 and the second reinforcing terminals 104-3 and 104-4 with respect to the shell 101 are not limited to the four corners of the shell 101, but may be set appropriately as needed according to, for example, the type or size of the connector.

The first reinforcing terminals 104-1 and 104-2 are located in a rear end portion of the shell 101, which is spaced from the opening 15, in and from which a plug is plugged and unplugged. In this embodiment, the first reinforcing terminals 104-1 and 104-2 are formed in the rear end portion of the shell 101 so as to rise from the bottom plate portion 10 and the side plate portions 12a and 12b of the shell 101 as an integral body.

The first reinforcing terminals 104-1 and 104-2 are soldered onto the reinforcement pads 112-1 and 112-2 of the wiring board 110A. Thus, a solder junction is formed between the first reinforcing terminals 104-1, 104-2 and the reinforcement pads 112-1 and 112-2, and with the solder junction thus formed, the first reinforcing terminals 104-1 and 104-2 are fixed to the wiring board 110A.

The second reinforcing terminals 104-3 and 104-4 are located in a front end portion of the shell 101 adjacent to the opening 15, in and from which a plug is plugged and unplugged. In this embodiment, the second reinforcing terminals 104-3 and 104-4 are formed in the front end portion of the shell 101 so as to rise up integrally from the side plate portions 12a and 12b and the upper plate portion 11 of the shell 101.

The second reinforcing terminals 104-3 and 104-4 are soldered onto the reinforcement pads 112-3 and 112-4 of the wiring board 110A. Thus, a solder junction is formed between the second reinforcing terminals 104-3 and 104-4 and the reinforcement pads 112-3 and 112-4, and with the solder junction thus formed, the second reinforcing terminals 104-3 and 104-4 are fixed to the wiring board 110A.

Most of the front surface 5a of the wiring board 110A is covered by a resist layer, and in the reinforcement pads 112-1, 112-2, 112-3 and 112-4, the resist layer is opened to expose the conductor layer. In this embodiment, guide grooves 131-1 and 131-2 to suction up excessive flux created in soldering are formed in the surface portion of the resist layer so as to be continuous from the reinforcement pads 112-3 and 112-4, respectively.

Figure 3:
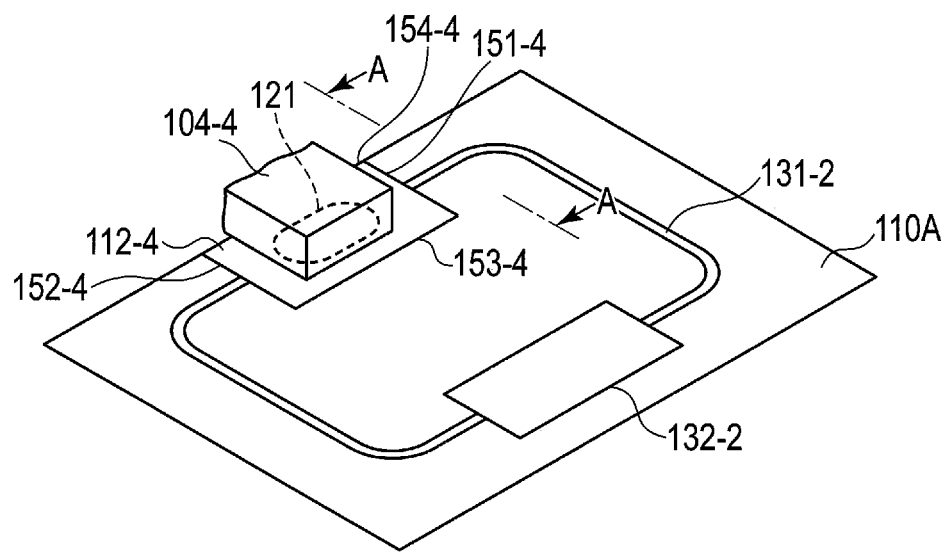
FIG. 3 is a diagram schematically showing a state of a guide groove used in the first embodiment before reflow.

FIG. 3 is a diagram schematically showing the state of the guide grooves used in the first embodiment before reflow.

For example, the reinforcement pad 112-4 has a rectangular shape as shown, with a pair of sides 151-4 and 152-4, perpendicular to the width direction of the shell 101, and a pair of sides 153-4 and 154-4, parallel to the width direction of the shell 101, and it can be obtained by forming an opening with a size of, for example, 1.5 mm×1.0 mm in the resist layer and exposing, for example, the conductor layer formed of copper.

The guide groove 131-2 used in the first embodiment has a structure as shown in FIG. 3, in which one end thereof is connected to one side 151-4 of the reinforcement pad 112-4 and the other end is connected to the side 152-4 opposing the side 151-4, to form a loop shape from near the reinforcement pad 112-4 over to a region on an opposite side to the shell 101.

Figure 4:
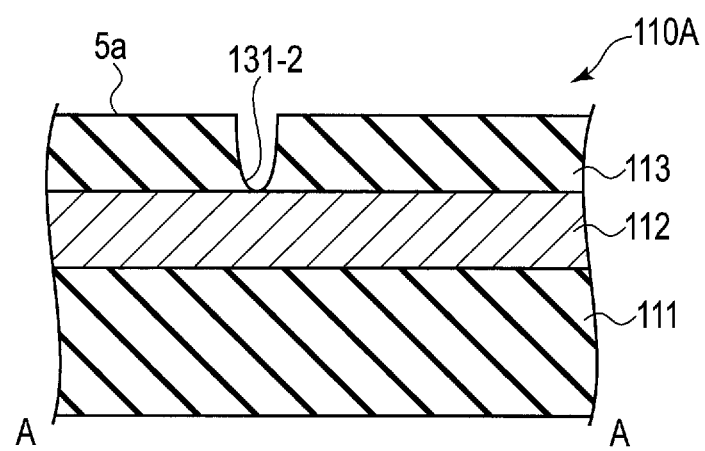
FIG. 4 is a cross section taken along line A-A in FIG. 3.

FIG. 4 is a cross section taken along line A-A in FIG. 3.

As shown, the wiring board 110A of the first embodiment has a structure in which a conductor layer 112 having a thickness of, for example, 18 μm and a resist layer 113 having a thickness of, for example, 15 μm are stacked on an insulating substrate 111 of a glass epoxy substrate or the like, having a thickness of, for example, 1 mm, and the guide groove 131-2 is formed in the resist layer 113 to have, for example, a width of 0.5 mm, such a depth which almost reaches the conductor layer 112, and a length of 5 mm. Note that if the guide groove 131-2 has a depth which reaches the conductor layer 112, the reinforcement pad 112-4 and the guide groove 131-2 can be prepared by the same patterning step.

The guide grooves are formed to suction out a part of solder material, that is, for example, excessive flux components melting out from the solder material, from a connection pad by capillarity and guide it not to enter the inside of any connector part, during reflow of solder. The size of the guide grooves may change due to the surface tension of flux, and therefore it can be changed appropriately as needed depending on the type of connector parts and the solder material employed. More specifically, they may be formed to have a width of 0.01 to 1 mm, preferably, 0.1 to 0.5 mm, and a depth of 10 to 15 μm. When the size of the guide grooves is in a range specified above, the flux components can be fully suctioned up by capillarity. Note that the number and shape of guide grooves may be changed appropriately as needed.

In a part of the guide groove 131-2, a flux reservoir 132-2 to reserve excessive flux is formed. The flux reservoir 132-2 is a depressed region, which can be obtained by, for example, forming an opening with a size of 3 mm×2 mm in the resist layer.

Such a guide groove that has a depth which reaches the conductor layer 112, as the guide groove 131-2, and the flux reservoir 132-2 can be prepared by photo lithography, electron beam lithography or the like.

Moreover, the flux reservoir 132-2 can be prepared by the same patterning step as that of the reinforcement pad 112-4 and the guide groove 131-2. The flux reservoir 132-2 can be provided in a position as distant as possible from the shell 101, and therefore the size and shape thereof can be changed arbitrarily each time needed.

On the reinforcement pad 112-4, a cream solder which contains, for example, Sn, Ag and Cu as solder metals is provided as a solder material 121. Via the solder material 121, the second reinforcing terminal 104-4 of the USB connector 100 is mounted on the reinforcement pad 112-4. A parts mounter can be used for mounting of the USB connector 100. The cream solder can be provided by solder-printing, for example, with an ordinary squeegee at a setting of: t=0.1 mm. As the cream solder, such a type can be used, that has high flux activating performance, capable of activating surfaces of parts to be connected. Usable examples of the solder metal are Sn, Ag and Cu.

The wiring board on which the USB connector 100 is thus mounted is heated in a reflow furnace to melt the solder, and then the first reinforcing terminals 104-1 and 104-2 and the second reinforcing terminals 104-3 and 104-4 are fixed to the reinforcement pads 112-1, 112-2, 112-3 and 112-4 provided on the wiring board 110A, thus obtaining a printed wiring board according to the first embodiment.

Let us now suppose here that according to a temperature profile of a reflow tub of the reflow furnace used in the first embodiment, the subject is heated in a heating unit up to 175° C. in 2 to 3 seconds, and pre-heated for 60 to 120 seconds in a pre-heating unit. Then, it is heated to 240° C. in a main heating unit and thereafter cooled to 220° C. Subsequently, the subject is cooled at a rate of −3° C./second in a cooling unit.

Figure 5:
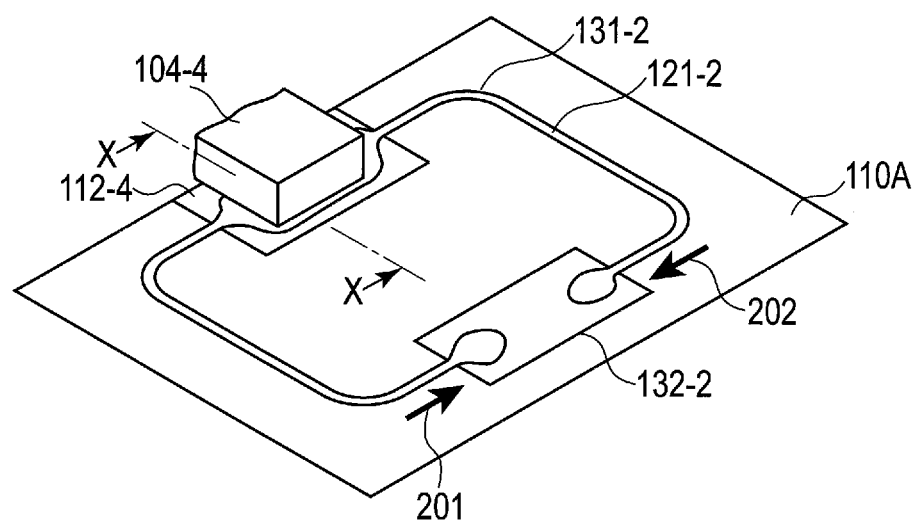
FIG. 5 is a diagram schematically showing the state after reflow in FIG. 3.

FIG. 5 is a diagram schematically showing a status of what is shown in FIG. 3 after the reflow.

As shown, a flux 121-2 melting out from the solder material 121 during the reflow is suction up from the reinforcement pad 112-4 by the capillarity in the guide groove 131-2, and is solidified in the guide groove 131-2. Further, excessive flux reaches the flux reservoir 132-2 from the guide groove 131-2, and is solidified as indicated by arrows 201 and 202.

Figure 6:
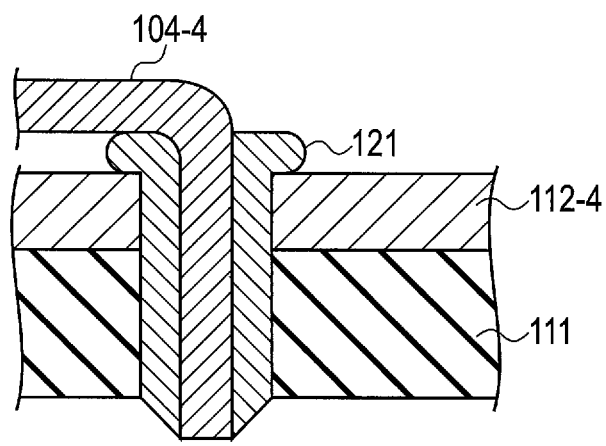
FIG. 6 is a cross section taken along line X-X in FIG. 3.

FIG. 6 is a cross section taken along line X-X in FIG. 5.

As shown, the second reinforcing terminal 104-4 is inserted to a through hole opened in the substrate 111 and the reinforcement pad 112-4 a conductor layer of which is exposed from the resist layer, and is joined to the reinforcement pad 112-4 with the solder material 121.

In the printed wiring board according to the first embodiment, inflow of excessive flux to the USB connector was not observed.

According to the first embodiment, the guide grooves are provided. With this structure, the excessive flux, which has lost a place to flow to after activating the surfaces of solder junctions of, reinforcement pins and lead pins while soldering, can be guided quickly by utilizing the capillarity, thereby making it possible to suppress the amount of entering insides of the connector parts.

Moreover, according to the first embodiment, the flux reservoirs are provided. With this structure, the excessive flux suctioned out on by the guide grooves can be separated to be solidified. The shape and size of the flux reservoirs are not particularly limited as long as they are capable of reserving excessive flux efficiently. Furthermore, with flux reservoirs, it is comparatively easy to check the amount of excessive solder by a visual inspection after mounting, and therefore a scale can be made for each flux reservoir by such a technique as silk printing, to measure the amount of excessive flux.

Note that when mounting the connector parts by the parts mounter, some other electronic parts can be also mounted and reflow soldering is carried out, thus obtaining a printed wiring board.

Second Embodiment

FIG. 7 is a diagram schematically showing the status of guide grooves used in the second embodiment before reflow.

As shown, two guide grooves 135-2 and 138-2 are connected to a reinforcement pad 112-4 of a wiring board used for the second embodiment. The guide groove 135-2 includes a first guide groove 133-2 connected to one side 151-4 of the reinforcement pad 112-4 and extending from the one side 151-4 in a direction towards a rear end portion of a shell 101, and a second guide groove 134-2 continuous to the first guide groove 133-2 and extending in a width direction of the shell 101 to be apart from the shell 101. Meanwhile, as in the case of the guide groove 135-2, the guide groove 138-2 comprises a first guide groove 136-2 connected to one side 152-4 opposing the one side 151-4 of the reinforcement pad 112-4 and extending from the one side 152-4 in a direction towards a front end portion of the shell 101 and a second guide groove 137-2 continuous to the first guide groove 136-2 and extending in the width direction of the shell 101 to be apart from the shell 101.

Figure 9:
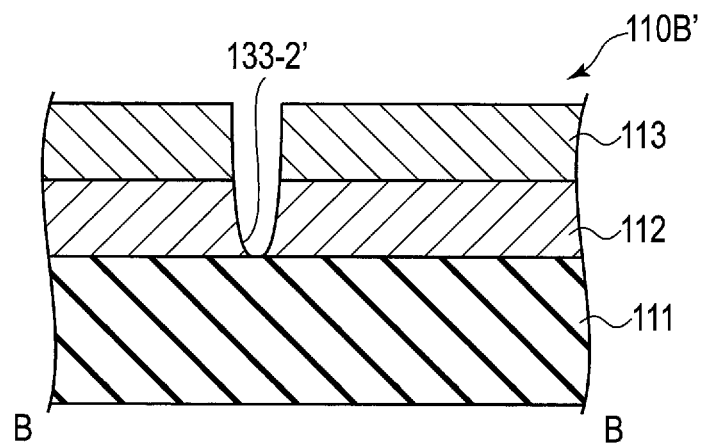
FIG. 9 is a diagram showing another example of a cross section taken along line B-B in FIG. 7.

FIG. 8 is an example of a cross section taken along line B-B in FIG. 7, and FIG. 9 is another example of the cross section taken along line B-B in FIG. 7.

A wiring board 110B used in the second embodiment has a structure in which a conductor layer 112 and a resist layer 113 are stacked on an insulating substrate 111, and the first guide grooves 133-2 has a size of 0.5 mm in width and 3 mm in length, and a depth less than the thickness of the resist layer 113 as shown in FIG. 8. With this structure, the first guide groove 133-2 is made of a resist, and the conductor layer 112 is not exposed. As in the case of the first guide groove 133-2, the guide grooves less deep than the thickness of the resist layer 113 can be formed by, for example, laser processing, cutting, re-application of resist or the like.

Moreover, a C-C section of the second guide groove 134-2 is similar to that of FIG. 4, and the second guide groove 134-2 has a depth which reaches the conductor layer 112. The width of the second guide groove 134-2 is 0.5 mm, and its length is 5 mm. When the second guide groove 134-2 has a depth which reaches the conductor layer 112, the reinforcement pad 112-4 and the second guide groove 134-2 can be prepared by the same patterning process.

As another example of the second embodiment, a wiring board 110B' with a first guide groove 133-2 whose depth differing from that of the wiring board 110B can be employed in place of the wiring board 110B. As shown in FIG. 9, the wiring board 110B' comprises a first guide groove 133-2' whose depth reaches the insulating substrate 111. With this structure, the insulating substrate 111 is exposed in a bottom portion of the first guide groove 133-2'. The guide grooves which reach the insulating substrate 111 as in the case of the first guide groove 133-2', can be prepared by patterning the conductor layer 112, in which, for example, the resist layer 113 is patterned by photo lithography or electron beam lithography, and then etching is carried out by using the resist layer as a mask. Or it can be prepared by laser processing or cutting.

Since solder metals have high wettability with respect to conductor layers, if the conductor layer is exposed in a bottom portion of a guide groove, solder metal may be guided, which may creating blocking of a guide groove. According to the printed wiring board of the second embodiment, when guide grooves 133-2 and 136-2 of the guide grooves 135-2 and 138-2, which are brought into contact with the reinforcement pad 112-4, are prepared to have such a structure that the conductor layer is not exposed in the bottom portion, the solder metal is not allowed to easily flow into the guide grooves 135-2 and 138-2 while heating, thereby making it possible to suppress the blocking by the solder metal and to suction up the flux only. Note that in the wiring board 110B', the conductor layer 112 is exposed to a side surface of the first guide groove 133-2; however, the influence by the side surface is less as compared with the bottom surface because the width of the first guide groove 133-2 is 0.5 mm and the thickness of the conductor layer 112 is 18 μm.

Except that the wiring board 110B or the wiring board 110B' is used and on-board connector parts are used in place of offset connector parts, a reflow is performed as in the case of the printed wiring board according to the first embodiment, and thus the printed wiring board according to the second embodiment is obtained.

Figure 10:
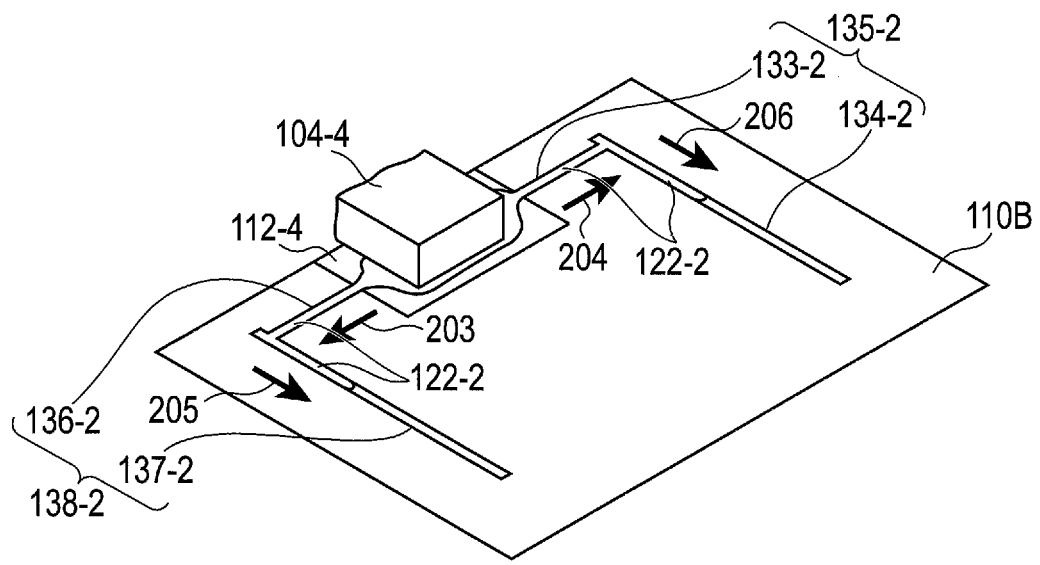
FIG. 10 is a diagram schematically showing the state after reflow in FIG. 7.

FIG. 10 is a schematic diagram showing a status of what is shown in FIG. 7 after reflow.

As shown, a flux 122-2 melting out from the solder material 121 during reflow is suctioned up from the reinforcement pad 112-4 by capillarity in the guide grooves 135-2 and 138-2 in directions indicated by arrow 204 and arrow 206 and in directions indicated by arrow 203 and arrow 205, and the flux reaches the middle of each of the second guide groove 134-2 and the second guide groove 137-2 and is solidified.

In the printed wiring board according to the second embodiment, inflow of excessive flux to the USE connector was not observed.

According to the second embodiment, the guide grooves are provided. With this structure, the excessive flux, which has lost a place to flow to while soldering, can be guided quickly by utilizing the capillarity, thereby making it possible to suppress the amount of entering insides of the connector parts.

Third Embodiment

FIG. 11 is a schematic diagram showing the status of guide grooves used in the third embodiment before reflow.

As shown, a wiring board 110C used in the third embodiment has a structure similar to that of FIG. 7 except a receptor film 140 formed from a resin film such as of polyimide having, for example, a rectangular shape with a size of 10 mm×10 mm and a thickness of 0.3 mm is adhered with an adhesive from the first guide groove 136-2 of the guide groove 138-2 connected to the reinforcement pad 112-4 over to the second guide groove 137-2 so as to increase the region where the capillarity occurs.

Examples of the material of the receptor film are heat-resistant resin films such as of PI, PTFE and polyester. Moreover, porous materials such as of ceramics, carbon materials and porous silica can be applied as well in addition to the resin films.

Except that the wiring board 110C provided with such guide grooves and a receptor film is used and on-board connector parts are used in place of offset connector parts, a reflow is performed similarly as in the case of the printed wiring board according to the according to the third embodiment is obtained.

FIG. 12 is a diagram schematically showing the states of what is shown in FIG. 11 after reflow.

As shown, the flux 124-2 melting out from the solder material 121 in a direction indicated by an arrow 208 during reflow is suctioned up from the reinforcement pad 112-4 by the capillarity in the guide groove 135-2, and reaches the middle of the guide groove 134-2 to be solidified there. On the other hand, the flux 123-2 melting out from the solder material 121 in a direction indicated by an arrow 207 is solidified between the receptor film 140 and the guide groove 138-2 by the capillarity occurring between the receptor film 140 and the guide groove 138-2. The amount of the solidified flux here is sufficiently greater than that of the flux solidified in the guide groove 135-2. Moreover, as in the case of the printed wiring board according to the second embodiment, when guide grooves 133-2 and 136-2 of the guide grooves 135-2 and 138-2, which are brought into contact with the reinforcement pad 112-4 are formed to have such a structure that the conductor layer is not expose to the bottom portion, the solder metal is not allowed to easily flow into the guide grooves 135-2 and 138-2 while heating, thereby making it possible to suppress the blocking by the solder metal and to suction up the flux only.

In the printed wiring board according to the third embodiment, inflow of excessive flux to the USB connector was not observed.

According to the third embodiment, the guide grooves and the receptor film are provided. With this structure, the excessive flux, which has lost a place to flow to while soldering, can be guided quickly by utilizing the capillarity, thereby making it possible to suppress the amount of entering insides of the connector parts.

Fourth Embodiment

Figure 13:
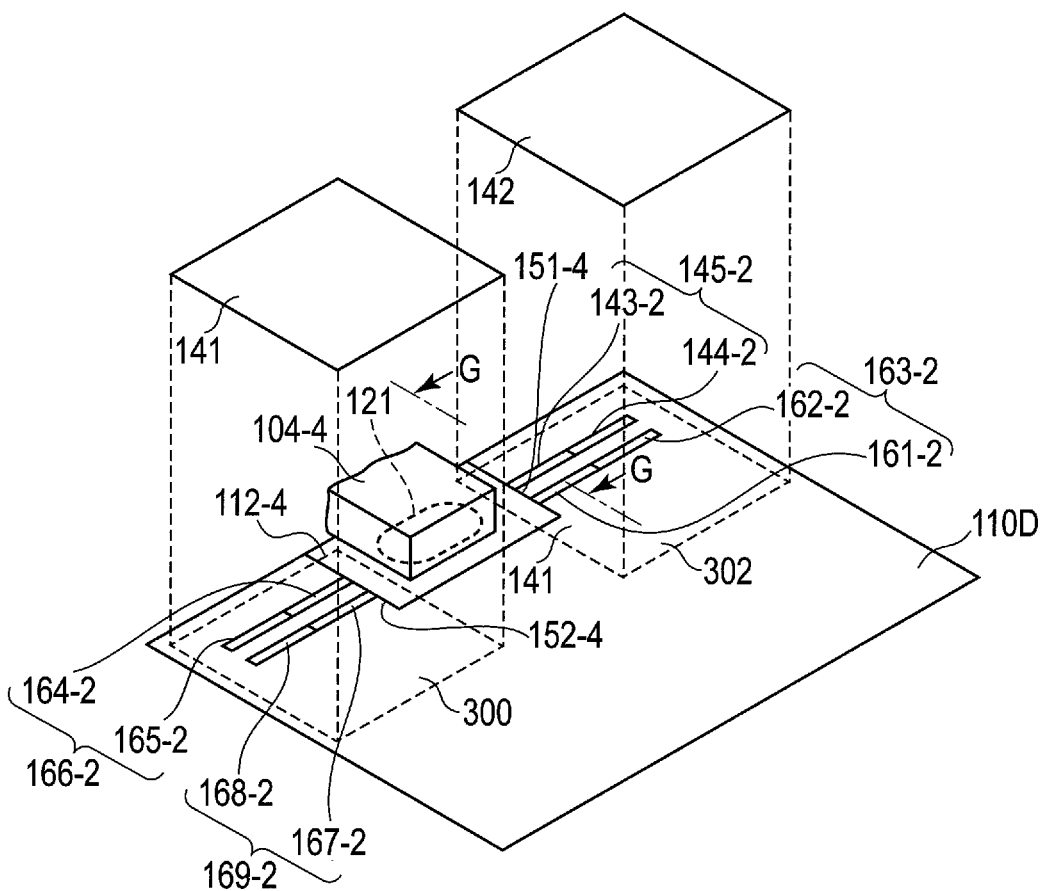
FIG. 13 is a diagram schematically showing a state of a guide groove used in the fourth embodiment before reflow.

FIG. 13 is a diagram schematically showing a status of guide grooves used in the fourth embodiment before reflow.

As shown, four guide grooves 145-2, 163-2, 166-2 and 169-2 are connected to a reinforcement pad 112-4 of a wiring board 110D used in the fourth embodiment. The guide groove 145-2 comprises a first guide groove 143-2 connected to one side 151-4 of the reinforcement pad 112-4 and extending from the one side 151-4 in a direction towards a rear end portion of the shell 101 and a second guide groove 144-2 continuous to the first guide groove 143-2 and extending in the direction towards the rear end portion. Moreover, the guide groove 163-2 is formed in parallel with the guide groove, and comprises a first guide groove 161-2 connected to one side 151-4 of the reinforcement pad 112-4 and extending from the one side 151-4 in a direction towards the rear end portion of the shell 101 as in the case of the guide groove 145-2, and a second guide groove 162-2 continuous to the first guide groove 161-2 and extending in a direction towards the rear end portion. The guide groove 166-2 comprises a first guide groove 164-2 connected to one side 152-4 opposing the one side 151-4 of the reinforcement pad 112-4 and extending from the one side 152-4 in a direction towards a front end of the shell 101 and a second guide groove 165-2 continuous to the first guide groove 164-2 and extending in a direction towards the front end portion of the shell 101. Moreover, a guide groove 169-2 is formed in parallel with the guide groove 166-2, and comprises a first guide groove 167-2 connected to one side 151-4 of the reinforcement pad 112-4 and extending from the one side 151-4 in a direction towards the front end portion of the shell 101 as in the case of the guide groove 166-2, and a second guide groove 168-2 continuous to the first guide groove 167-2 and extending in the direction towards the rear end portion.

Figure 14:
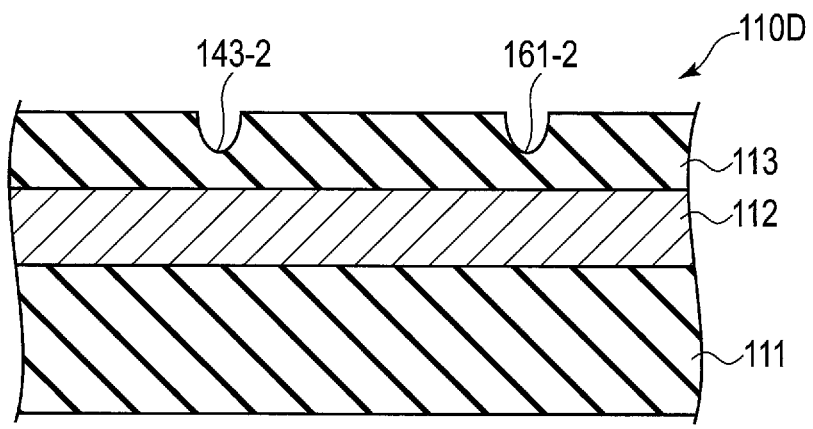
FIG. 14 is a diagram showing an example of a cross section taken along line G-G in FIG. 13.

FIG. 14 shows an example of a cross section taken along line G-G in FIG. 13.

A wiring board 110D used in the fourth embodiment has a structure in which a conductor layer 112 and a resist layer 113 are stacked on an insulating substrate 111, and the first guide grooves 143-2 has a size of 0.5 mm in width and 1 mm in length, and a depth less than the thickness of the resist layer 113 as shown in FIG. 14. Similarly, the first guide grooves 161-2 has a size of 0.5 mm in width and 1 mm in length, and a depth less than the thickness of the resist layer 113 as shown in FIG. 14. With this structure, the first guide grooves 143-2 and 161-2 are made of a resist, and the conductor layer 112 is not exposed. Similarly, the first guide groove 164-2 and the first guide groove 167-2 also have a width of 0.5 mm and a length of 3 mm, and have a depth less than the thickness of the resist layer 113. Moreover, the length of the first guide grooves used in the fourth embodiment is less than the length of the first guide grooves used in the second and third embodiments.

Furthermore, the second guide grooves 144-2, 162-2, 165-2 and 168-2 each have a depth which reaches the conductor layer 112. The width of the second guide grooves 144-2, 162-2, 165-2 and 168-2 is 0.5 mm, and the length thereof is 4 mm. When the second guide groove 144-2, 162-2, 165-2 and 168-2 have a depth which reaches the conductor layer 112, the second guide grooves of the reinforcement pad 112-4 can be prepared by the same patterning process. Moreover, the length of the second guide grooved used in the fourth embodiment is less than, by about a half of, the length of the second guide grooves used in the second and third embodiments.

However, in the fourth embodiment, two receptor films 141 and 142 each formed from, for example, a rectangular polyimide sheet having a size of 10 mm×10 mm and 3 mm in thickness are prepared, and adhered onto a region 300 on the guide groove 166-2 and the guide groove 169-2 and a region 302 on the guide groove 145-2 and the guide groove 163-2 with a PI film. With this structure, gaps are created between lower surfaces of the films and the board 110D, and thus the region where capillarity can occur is further increased.

Except that the wiring board 110D provided with such short four guide grooves and two receptor film is used and on-board connector parts are used in place of offset connector parts, a reflow is performed similarly as in the case of the printed wiring board according to the first embodiment, and thus the printed wiring board according to the fourth embodiment is obtained.

Figure 15:
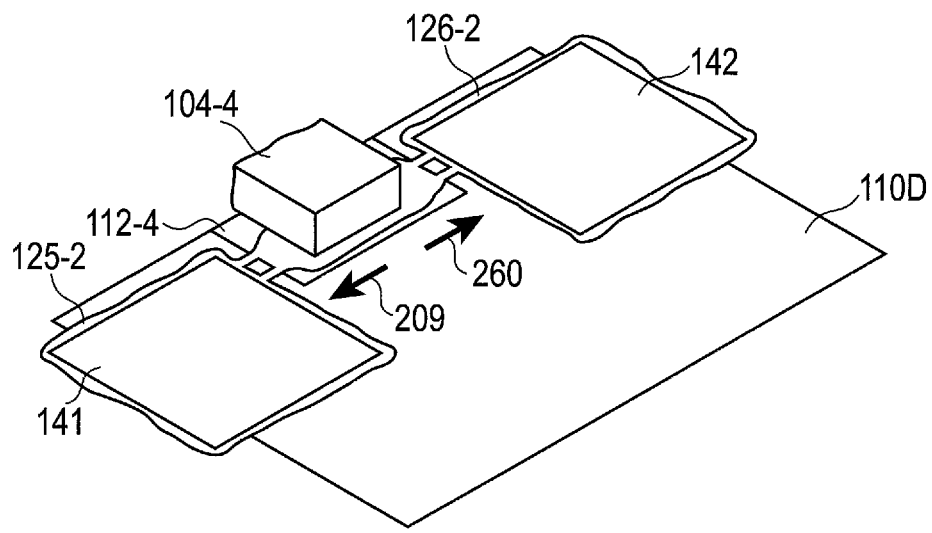
FIG. 15 is a diagram schematically showing the state after reflow in FIG. 13.

FIG. 15 is a diagram schematically showing the states of what is shown in FIG. 13 after reflow.

As shown, a flux 126-2 melting out from the solder material in a direction indicated by an arrow 260 during reflow is suctioned up from the reinforcement pad 112-4 by the capillarity in the guide grooves 145-2 and 163-2, and solidified between the receptor film 142 and the guide grooves 145-2, 163-2 and the wiring board 110D. Similarly, a flux 125-2 melting out in a direction indicated by an arrow 209 is suctioned up from the reinforcement pad 112-4 by the capillarity in the guide grooves 166-2 and 169-2, and solidified between the receptor film 141 and the guide grooves 166-2, 169-2 and the wiring board 110D.

In the printed wiring board according to the fourth embodiment, inflow of excessive flux to the USB connector was not observed.

According to the fourth embodiment, as in the cases of the printed wiring boards of the second and third embodiments, guide grooves 143-2, 161-2, 164-2 and 167-2 of the guide grooves 145-2, 163-2, 166-2 and 169-2, which are brought into contact with the reinforcement pad 112-4, are formed to have such a structure that the conductor layer is not expose to the bottom portion. With this structure, the solder metal is not allowed to easily flow into the guide grooves 143-2, 161-2, 164-2 and 167-2 while heating, thereby making it possible to suppress the blocking by the solder metal and to suction up the flux only. Note that it suffices if the depth of the first guide grooves 143-2, 161-2, 164-2 and 167-2 is such a degree that the conductor layer 112 is not exposed to the bottom portion, and the depth may be such that reaches the insulating substrate 111 in place of making it less deep than the thickness of the resist layer 113.

According to the fourth embodiment, four guide grooves and two receptor films are provided. With this structure, even if the length of the guide grooves is less, the excessive flux, which has lost a place to flow to while soldering, can be guided quickly by utilizing the capillarity, thereby making it possible to suppress the amount of entering insides of the connector parts. Further, even if the amount of absorption and the absorption rate only by the guide grooves are not sufficient, it is still possible to increase the region where capillarity can occur and to receive more flux quickly by employing a plurality of receptor films and/or adjusting the area of the receptor films.

Fifth Embodiment

Figure 16:
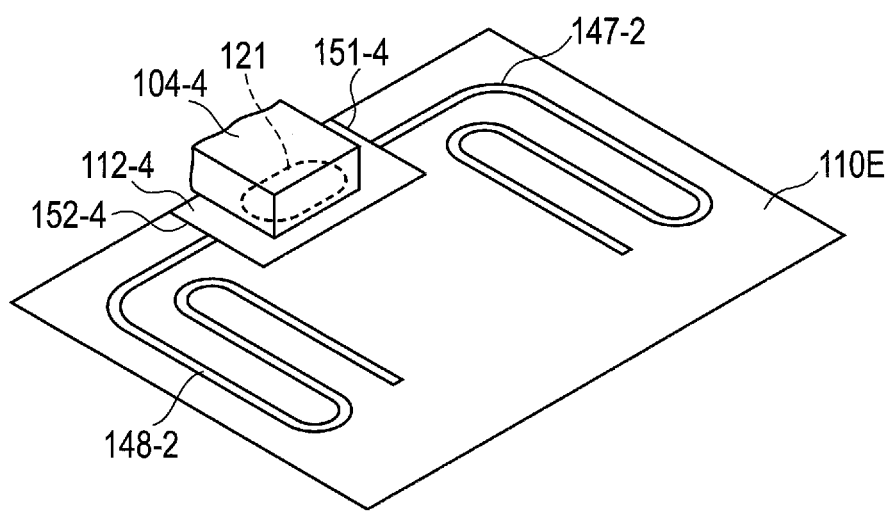
FIG. 16 is a diagram schematically showing a state of a guide groove used in the fifth embodiment before reflow.

FIG. 16 is a diagram schematically showing the status of guide grooves used in the fifth embodiment before flow.

As shown, two guide grooves 147-2 and 148-2 are connected to a reinforcement pad 112-4 of a wiring board 110E used in the fifth embodiment. The guide groove 147-2 is connected to one side 151-4 of the reinforcement pad 112-4, and formed into such a shape that it is folded up from a rear end portion side of the reinforcement pad 112-4 over to a region on an opposite side to the shell 101. The guide groove 147-2 has, for example, a width of 0.5 mm, such a depth which reaches the conductor layer 112, and a length of 30 mm, and is about 3 times long as the guide grooves used in the first to fourth embodiments. On the other hand, the guide groove 148-2 is connected to one side 152-4 opposing the one side 151-4 and is bent from the front end side of the reinforcement pad 112-4 over to the region on an opposite side to the shell 101. The guide groove 147-2 has, for example, a width of 0.5 mm, such a depth which reaches the conductor layer, and a length of 30 mm, and is about 3 times long as the guide grooves used in the first to fourth embodiments.

Except that the wiring board 110E provided with such guide grooves and receptor films is used and on-board connector parts are used in place of offset connector parts, a reflow is performed similarly as in the case of the printed wiring board according to the first embodiment, and thus the printed wiring board according to the fifth embodiment is obtained.

Figure 17:
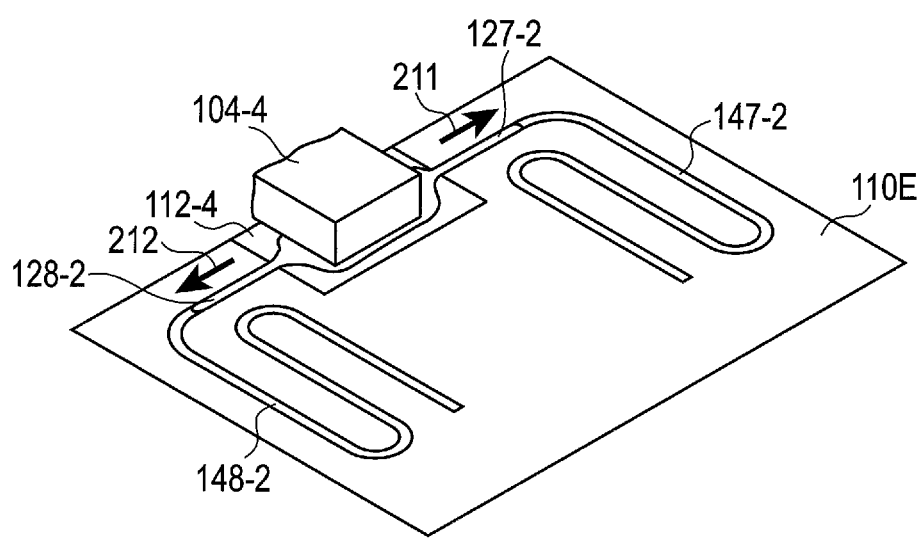
FIG. 17 is a diagram schematically showing the state after reflow in FIG. 16.

FIG. 17 is a diagram schematically showing the states of what is shown in FIG. 16 after reflow.

As shown, a flux 127-2 melting out from the solder material in a direction indicated by an arrow 211 during reflow is suctioned up from the reinforcement pad 112-4 by the capillarity in the guide groove 147-2, and solidified in the middle of the guide groove 147-2. Similarly, a flux 128-2 melting out in a direction indicated by an arrow 212 is suctioned up from the reinforcement pad 112-4 by the capillarity in the guide groove 148-2 and solidified in the middle of the guide groove 148-2.

In the printed wiring board according to the fifth embodiment, inflow of excessive flux to the USB connector was not observed.

According to the fifth embodiment, the guide grooves are provided as described above. With this structure, the excessive flux, which has lost a place to flow to while soldering, can be guided quickly by utilizing the capillarity, thereby making it possible to suppress the amount of entering insides of the connector parts. Moreover, it is possible to receive more flux quickly by increasing the length of the guide grooves to increase the amount of suction.

Figure 18:
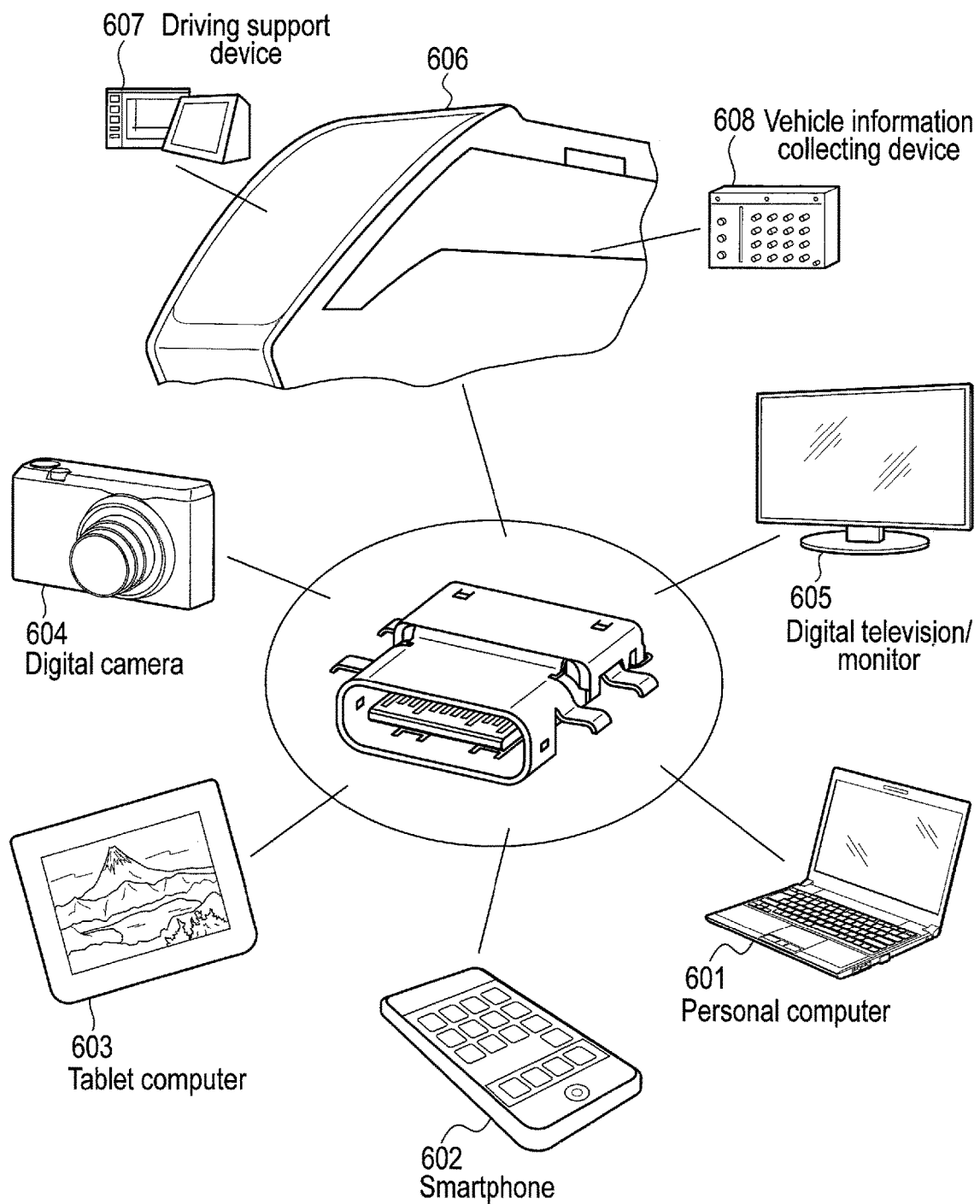
FIG. 18 is a diagram illustrating an electronic device to which these embodiments can be applied.

FIG. 18 is a diagram showing electronic devices to which these embodiments can be applied, which are, for example, a personal computer 601, a smartphone 602, a tablet computer 603, a digital camera 604, a digital television/monitor 605, and a driving support device 607 and a vehicle information collecting device 608 of a railway vehicle 606. These electronic devices are each provided with a connector of each of these embodiments, to be connecting with an external device. When the present embodiments are applied to these electronic devices, troubles which may occur when the connector is plugged can be suppressed or improved, thus making it possible to remarkably raise the reliability of the connector.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A printed wiring board comprising:
   a wiring board including a first main surface and a second main surface opposite to the first main surface;
   a connector part;
   a connection pad provided between the wiring board and the connector part and connected with the connector part with a solder material; and
   a guide groove provided on the first main surface to extend from the connection pad, to guide a portion of the solder material from the connection pad.

2. The wiring board of claim 1, further comprising:
   a recessed region provided continuous to the guide groove, to receive the portion of the solder material.

3. The wiring board of claim 1, further comprising:
   a receptor film provided on the guide groove, to hold the portion of the solder material guided from the connection pad.

4. The wiring board of claim 3, wherein
   the receptor film is a resin film.

5. The wiring board of claim 1, wherein
   the wiring board includes an insulating substrate, an insulating layer and a conductor layer prepared between the insulating substrate and the insulating layer, and
   at least a part of the guide groove, which is near the connection pad has a depth less than a thickness of the conductor layer.

6. The wiring board of claim 1, wherein
   the wiring board includes an insulating substrate, an insulating layer and a conductor layer prepared between the insulating substrate and the insulating layer, and
   at least a part of the guide groove, which is near the connection pad has a depth which reaches the insulating substrate.

7. The wiring board of claim 1, wherein the guide groove extends to be apart from the connector part.

8. The wiring board of claim 1, wherein the guide groove extends in a direction towards at least a front end portion or a rear end portion of the connector part.

9. The wiring board of claim 1, wherein the guide groove comprises:
   a first guide groove which has a first depth, and is connected with the connection pad, and
   a second guide groove which has a second depth greater than the first depth, and is continuous to the first guide groove.

\* \* \* \* \*